United States Patent
Hugo

(10) Patent No.: US 8,268,074 B2
(45) Date of Patent: Sep. 18, 2012

(54) METHOD AND DEVICE FOR PRODUCING ORIENTED SOLIDIFIED BLOCKS MADE OF SEMI-CONDUCTOR MATERIAL

(75) Inventor: Franz Hugo, Aschaffenburg (DE)

(73) Assignee: Rec Scan Wafer AS, Porsgrunn (NO)

( * ) Notice: Subject to any disclaimer, the term of this patent is extended or adjusted under 35 U.S.C. 154(b) by 1112 days.

(21) Appl. No.: 11/883,489

(22) PCT Filed: Feb. 3, 2006

(86) PCT No.: PCT/EP2006/000972
§ 371 (c)(1),
(2), (4) Date: Apr. 2, 2008

(87) PCT Pub. No.: WO2006/082085
PCT Pub. Date: Aug. 10, 2006

(65) Prior Publication Data
US 2011/0308448 A1    Dec. 22, 2011

(30) Foreign Application Priority Data
Feb. 3, 2005    (DE) .......................... 10 2005 005 182

(51) Int. Cl.
*C30B 11/00*    (2006.01)
(52) U.S. Cl. ................. 117/83; 117/73; 117/74; 117/81; 117/200; 117/201; 117/202; 117/204; 117/206
(58) Field of Classification Search ............. 117/73–74, 117/81, 83, 200–202, 204, 206
See application file for complete search history.

(56) References Cited

U.S. PATENT DOCUMENTS

| | | | |
|---|---|---|---|
| 5,988,257 A | 11/1999 | Hugo et al. | |
| 6,110,274 A * | 8/2000 | Okuno | 117/81 |
| 6,136,091 A * | 10/2000 | Yamazaki et al. | 117/81 |
| 2004/0079276 A1 * | 4/2004 | Muhe | 117/81 |

FOREIGN PATENT DOCUMENTS

| | | |
|---|---|---|
| DE | 23 32 388 A1 | 1/1975 |
| DE | 198 55 061 A1 | 5/2000 |
| EP | 1 048 758 A1 | 11/2000 |
| EP | 1048758 * | 11/2000 |
| EP | 1 072 696 A | 1/2001 |
| GB | 1 414 087 | 11/1975 |
| GB | 1414087 * | 11/1975 |
| JP | 7-37670 B2 | 4/1995 |

* cited by examiner

Primary Examiner — Michael Kornakov
Assistant Examiner — Kenneth A Bratland, Jr.
(74) Attorney, Agent, or Firm — Birch, Stewart, Kolasch & Birch, LLP

(57) ABSTRACT

A method and a device for producing oriented solidified blocks made of semi-conductor material are provided. The device includes a crucible, in which melt is received, and has an insulation which surrounds the crucible at least from the top and from the side and which is arranged at a distance therefrom at least above the crucible, and at least one heating device which is arranged above the crucible. The region inside the insulation above the crucible is divided by an intermediate cover in a process chamber and a heating chamber is arranged thereabove, where at least one heating element is arranged.

27 Claims, 1 Drawing Sheet

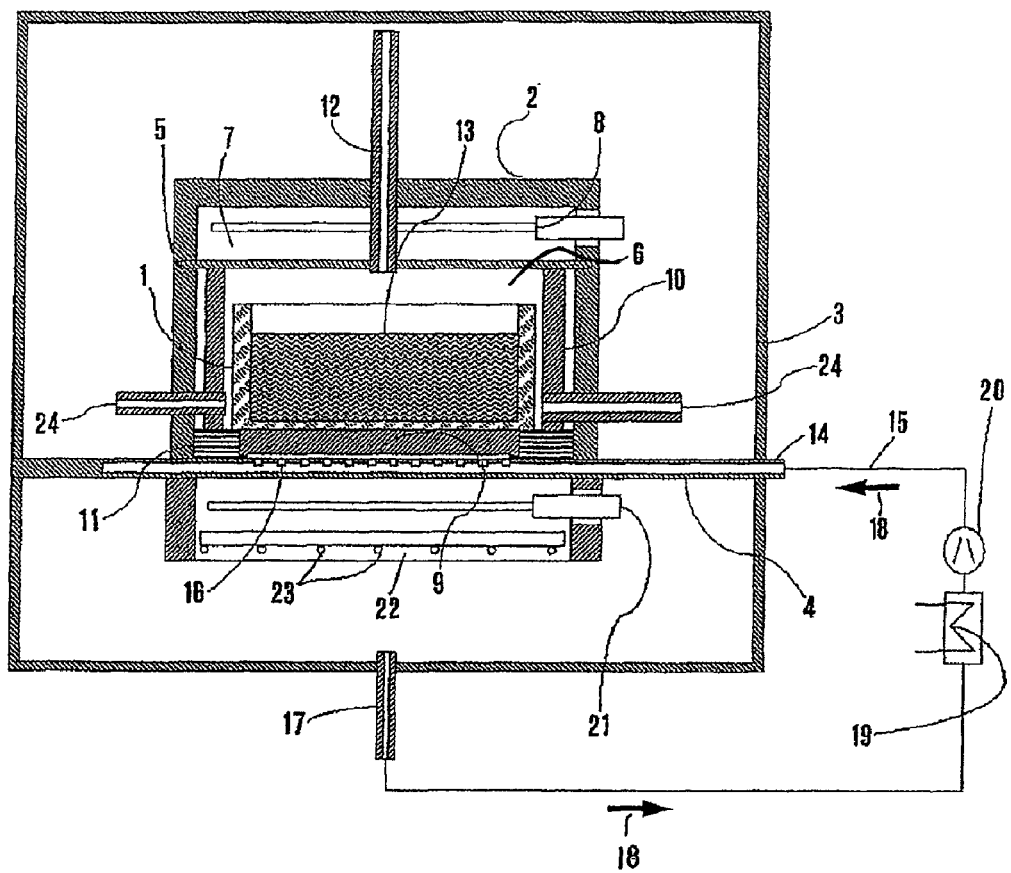

METHOD AND DEVICE FOR PRODUCING ORIENTED SOLIDIFIED BLOCKS MADE OF SEMI-CONDUCTOR MATERIAL

BACKGROUND OF THE INVENTION (1) Field of the Invention

The invention relates to a method for producing oriented solidified blocks made of semi-conductor material, in which the melt, which is received in a crucible, is heated, at least from the top side, in a process chamber for the purpose of oriented solidification, making use of crystallisation.

The invention also relates to a device for producing oriented solidified blocks made of semi-conductor material, with a crucible, wherein melt is received, and insulation which surrounds the crucible at least from the top and from the side and which is arranged at a distance therefrom at least above the crucible, and having at least one heating device which is arranged above said crucible.

(2) Description of Related Art

In prior art methods and devices for the production of oriented solidified blocks made of semi-conductor material, in particular from oriented solidified silicon, the melt, which is received in a crucible, is heated either from the side or from the top. The advantage of heating from the top is that good horizontal energy distribution resulting in achieving the intended horizontal phase boundary during solidification. The disadvantage, however, is that the heating element is located directly in the vapour flow from the semi-conductor material, such as silicon, which is kept liquid during solidification and therefore reacts with the semi-conductor material. Where graphite heating elements are typically used in the state of the art, this leads to rapid ageing and also to a change in electrical resistance with ensuing consequences.

SUMMARY OF INVENTION

The object of the present invention is to provide a method and a device for producing oriented solidified blocks, i.e. conducting a crystallisation process, which in particular avoid the ageing of heating elements due to the effect of the metal vapour, and additionally offer the option of being able to heat the melt in a defined and reproducible manner.

The problem is solved by a method for producing oriented solidified blocks made from semi-conductor material, in which the melt, which is received in a crucible, is heated in a process chamber for the purpose of oriented solidification, making use of crystallisation, at least from the top side, characterised in that the heating of the crucible is carried out indirectly from above via an upper heating chamber, which is separate from the process chamber.

In terms of the device, the problem is solved by a device for producing oriented solidified blocks made from semi-conductor material, with a crucible, in which the melt is received, and with insulation which surrounds the crucible at least from the top and from the side and which is arranged at a distance therefrom at least above the crucible, and having at least one heating device which is arranged above said crucible, characterised in that the region inside the insulation above the crucible is divided by an intermediate cover into a process chamber and a heating chamber arranged above this, in which at least one heating element is arranged.

This method and this device are characterised in that no direct contact occurs between the metal vapour emitted by the metal melt and the heating elements. Preferably, the method can be conducted in such a way that the crucible is heated at least from the upper side via the upper heating chamber and the process chamber for oriented solidification, making use of crystallisation, without the upper heating elements being affected.

In particular in connection with the inventive device, the method is conducted such that the upper heating device is separated gas-tight via an intermediate cover above the crucible and thus above the melt, so that the metal vapour, such as silicon vapour, rising from the heated melt, is kept away from this active heating element.

For preference, measures are also provided for the gas created above the melt in the process chamber to be vented in such a way that it does not reach the heating chamber.

Furthermore, for preference, in order to achieve the intended objectives, the intermediate cover is laid on a frame; such a frame surrounds the crucible laterally at a distance. Such a frame should be made from an insulating material and should, in relation to the external insulation, form intermediate insulating walls, which means that the external insulation surrounds the intermediate insulation walls at a distance, forming a gap.

The crucible is supported on a supporting plate, which, in a further embodiment of the device, has on its marginal areas a border as part of a passe-partout; with this border of the passe-partout the supporting plate is essentially sealed gas-tight against the intermediate insulation.

The whole crucible together with its insulation is arranged in a vacuum chamber.

The frame of the passe-partout, which laterally surrounds the crucible's support plate, simultaneously forms a collecting basin or part of a collecting basin for any melt which might escape from the crucible. In relation to such a collecting basin, the frame which laterally surrounds the crucible can form the side walls of the collecting basin. Furthermore, the base of the collecting basin can be formed by the crucible's support plate which is inserted in the passe-partout.

The passe-partout is preferably constructed of graphite or of a combination of graphite plates and/or graphite sheets. It may also be advantageous to construct the side walls of the collecting basin out of silicon-absorbing graphite felt.

An opening or mouth may be provided in the passe-partout in the projection of the horizontal, geometric melt area to act as a heat transfer window.

To prevent any escape of melt or melt vapours from the interior of the device, the gap through which the silicon can run out or escape should be constructed in labyrinthine steps.

The support structure on which the crucible or the support plate which supports the crucible, is supported, i.e. from which it rises, can simultaneously be designed as a gas supply. To this end, preferably at least one supporting beam is provided, which is provided on its side facing the crucible base with gas outlet openings, for example nozzle openings, through which the cooling gas can be carried to the underside of the base plate of the crucibles or the support plate. The heated cooling gas is preferably recooled in the circuit via a heat exchanger and returned to the supporting beam by means of a pump.

Underneath the crucible base, or more precisely underneath the supporting beam, a lower, active heating element is arranged at a distance, under which lies a cooling plate with cooling coils, in order to be able also to actively heat and cool the crucible from below, in particular in interaction with the upper heating element arranged in the upper heating chamber.

Finally, lateral degassing openings can be provided leading through the side walls of the external insulation and the intermediate insulation.

BRIEF DESCRIPTION OF THE DRAWING

This FIGURE is a perspective view of one embodiment of the present invention.

DETAILED DESCRIPTION OF THE INVENTION

Further details and features of the present invention are given in the following description of an embodiment with the aid of the drawing, which shows a single FIGURE, in which a device according to the invention is shown diagrammatically in section.

The device shown in the FIGURE serves to produce oriented solidified blocks made from semi-conductor material, in particular from a silicon melt. The device has a crucible 1, which is surrounded by external insulation 2 from above and from the sides. This external insulation 2 is located at a distance from the side walls and from the upper side of the crucible 1.

Said crucible 1 with external insulation 2 is arranged in a vacuum chamber 3 and is held therein by means of a support beam 4, which will be described in more detail below.

Above the crucible 1 is arranged an intermediate cover 5, which divides the space above the crucible 1 into a process chamber 6 and an upper heating chamber 7. An active heating element 8, running horizontally, is arranged in the upper heating chamber 7, between the intermediate cover 5 and the upper cover part of the insulation 2. The intermediate cover 5 is further laid and supported on an intermediate insulation 10, forming a frame, said insulation being arranged at a distance, firstly at the side of the side walls of the crucible 1 and secondly at a distance from the external insulation 2, in each case forming intermediate spaces.

The upper heating chamber 7 is essentially sealed off gastight from the process chamber 6 by the intermediate cover 5.

The crucible 1 is supported on a support plate 9, which simultaneously forms the base of the external insulation 2. As can be seen from the FIGURE, the support plate 9 is laid in a so-called passe-partout 11, which essentially seals off the support plate 9 gas-tight at its marginal areas from the intermediate insulation 10.

A tubular flushing gas feed 12 is provided in the upper area of the device, and this passes through the intermediate cover 5 and the upper cover of the external insulation 2 and ends with its other end inside the vacuum chamber 3.

The intermediate insulation 10 mentioned above in connection with the passe-partout 11 and the crucible support plate 9 simultaneously serve as a collecting basin for any melt which may escape from the crucible 1. The passe-partout 11 can be made of graphite or of a combination of graphite plates and graphite sheets, and may be suitably layered. The side walls of the collecting basin, which in the present embodiment represents the intermediate insulation 10, can be made from a silicon-absorbing graphite felt.

Although it cannot be seen in detail in the sectional view in the FIGURE, the passe-partout 11, in the projection onto the horizontal, geometric melt surface, designated by reference number 13, has an opening serving as a heat transfer window.

It should be mentioned that all gaps through which silicon and/or the melt which has been melted in the crucible 1 might escape are designed as labyrinthine steps, which successively fill with melt escaping from the basin, the melt increasingly solidifies due to heat dissipation and such gaps then safely close again.

The supporting beam 4 is tubular in form and simultaneously serves as a gas supply pipe; to this purpose, the tubular end 14 is conducted outside through the wall of the vacuum chamber 3, on the right side in the FIGURE, and connected to a gas supply line 15. In the side of the supporting beam 4 facing towards the crucible base, there are nozzle openings 16, through which cooling gas can flow via the tubular supporting beam 4 on the underside of the support plate 4, and thus to the base plate of the crucible 1. The cooling gas is carried back in the circuit from a cooling gas outlet 17, in the direction of the flow arrows 18, via a heat exchanger 19 and a cooling gas circulating pump 20.

A lower active heating element 21 is arranged underneath the supporting beam 4, at a distance therefrom. Underneath this heating element 4 there is a cooling plate 22 with cooling coils 23 arranged on the underside, which enable active cooling of the lower region of the arrangement by supplying an appropriate coolant.

By means of the upper heating element 8, the lower heating element 21, the gas supply via the supporting beam 4 and the lower cooling plate 22, an oriented solidification of the melt can be achieved by appropriate control of heating and cooling.

Degassing openings 24 are provided in the lower region between the walls of the crucible 1 and the intermediate insulation 10 for effective degassing of the process chamber 6, said openings leading into the space externally delimited by the vacuum chamber 3.

The invention claimed is:

1. A method for producing oriented solidified blocks made from semi-conductor material, wherein a melt, which is received in a crucible, is heated, at least from a top side, in a process chamber for the purpose of oriented solidification, making use of crystallisation, wherein the heating of the crucible is carried out indirectly from above via an upper heating chamber, which is separate from the process chamber, and wherein the upper heating chamber is essentially sealed gas-tight against the process chamber by an intermediate cover.

2. The method according to claim 1, wherein for the purpose of oriented solidification, making use of crystallisation, the upper heating chamber and the process chamber are heated at least from an upper side.

3. A device for producing oriented solidified blocks made from semi-conductor material, the device comprising:
   a crucible, in which a melt is received;
   an insulation surrounding the crucible, at least from a top and from a side, the insulation being arranged at a distance therefrom, at least above the crucible;
   at least one heating device is arranged above said crucible; and
   at least one heating element,
   wherein a region inside the insulation above the crucible is divided by an intermediate cover into a process chamber and a heating chamber arranged there above, and
   wherein the heating chamber is essentially sealed gas-tight against the process chamber by the intermediate cover.

4. The device according to claim 3, wherein the crucible is supported on a support plate.

5. The device according to claim 4, wherein the intermediate cover rests on a frame which surrounds the crucible laterally at a distance.

6. The device according to claim 5, wherein the frame is made from an insulating material, forming intermediate insulating walls.

7. The device according to claim 5, wherein the frame is arranged at a distance from the insulation, forming an intermediate space.

8. The device according to claim 4 or 5, wherein the crucible support plate is inserted in a passe-partout.

9. The device according to claim 8, wherein the passe-partout is made from graphite.

10. The device according to claim 8, wherein the passe-partout is made from a combination of graphite plates and/or graphite sheets.

11. The device according to claim 8, wherein the marginal areas of the passe-partout essentially seal off the support plate gas-tight from the frame.

12. The device according to claim 3 wherein a flushing gas feed is provided, which starts from the upper region of the process chamber.

13. The device according to claim 12, wherein the flushing gas feed is guided through the intermediate cover.

14. The device according to claim 12, wherein the crucible is arranged with insulation in a vacuum chamber.

15. The device according to claim 13, wherein the flushing gas feed directly links the process chamber with the vacuum chamber.

16. The device according to claim 8, wherein the frame in conjunction with the passe-partout and the crucible support plate is simultaneously designed to act as collecting basin for escaping melt.

17. The device according to claim 16, wherein the side walls of the collecting basin are formed by the frame.

18. The device according to claim 16, wherein the base of the collecting basin is formed by the crucible support plate inserted in the passe-partout.

19. The device according to claim 17, wherein the side walls of the collecting basin are made from silicon-absorbing graphite felt.

20. The device according to claim 8, wherein the passe-partout has an opening serving as a heat transfer window in the projection onto the horizontal, geometric melt surface.

21. The device according to claim 3, wherein the gaps through which silicon could escape are designed as labyrinthine steps.

22. The device according to claim 4, wherein the support plate is supported by at least one supporting beam.

23. The device according to claim 22, wherein the supporting beam is simultaneously designed as a gas supply line.

24. The device according to claim 23, wherein in the side of the supporting beam facing towards the crucible base, there are arranged nozzle openings, through which cooling gas is directed via the supporting beam designed as a gas supply line, to the underside of the crucible base or of the crucible support plate.

25. The device according to claim 24, wherein the cooling gas is recooled in the circuit by means of a heat exchanger and fed by a pump to the supporting beam.

26. The device according to claim 4, wherein a lower active heating element is arranged underneath the support plate of the crucible, at a distance therefrom.

27. The device according to claim 26, wherein a cooling device is arranged underneath the heating element.

* * * * *